(12) United States Patent
Lee

(10) Patent No.: US 7,894,278 B2
(45) Date of Patent: Feb. 22, 2011

(54) SEMICONDUCTOR MEMORY DEVICE AND METHOD FOR OPERATING THE SAME

(75) Inventor: Sang-Hee Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 127 days.

(21) Appl. No.: 12/327,754

(22) Filed: Dec. 3, 2008

(65) Prior Publication Data

US 2010/0008156 A1    Jan. 14, 2010

(30) Foreign Application Priority Data

Jul. 10, 2008    (KR) ...................... 10-2008-0067175

(51) Int. Cl.
  *G11C 7/00*    (2006.01)
(52) U.S. Cl. ............................. 365/189.05; 365/233.5
(58) Field of Classification Search ............ 365/189.05, 365/233.5
  See application file for complete search history.

(56) References Cited

U.S. PATENT DOCUMENTS

| | | | | |
|---|---|---|---|---|
| 6,556,505 B1 * | 4/2003 | Tojima et al. | .......... | 365/233.11 |
| 6,597,627 B2 * | 7/2003 | Arata et al. | ............. | 365/233.16 |
| 6,707,727 B2 * | 3/2004 | Tamura et al. | .............. | 365/192 |
| 6,735,732 B2 * | 5/2004 | Yamada | ...................... | 714/744 |

FOREIGN PATENT DOCUMENTS

KR    1020050062842 A    6/2005

OTHER PUBLICATIONS

Notice of Preliminary Rejection issued from Korean Intellectual Property Office on Jul. 30, 2009 with an English Translation.

* cited by examiner

*Primary Examiner*—Michael T Tran
(74) *Attorney, Agent, or Firm*—IP & T Group LLP

(57) ABSTRACT

A semiconductor device includes a plurality of input units configured to receive a plurality of data, a plurality of latching units configured to latch output signals of the plurality of input units in response to a plurality of synchronization clock signals, and a synchronization clock generating unit configured to delay a source clock signal by a time corresponding to each of signal transmission times taken between the plurality of input units and the plurality of latching units, thereby generating the plurality of synchronization clock signals.

14 Claims, 2 Drawing Sheets

SEMICONDUCTOR MEMORY DEVICE AND METHOD FOR OPERATING THE SAME

CROSS-REFERENCE TO RELATED APPLICATION

The present invention claims priority of Korean patent application number 10-2008-0067175, filed on Jul. 10, 2008, which is incorporated by reference in its entirety.

BACKGROUND OF THE INVENTION

The present invention relates to semiconductor design technology, and more particularly, to a semiconductor memory device for synchronizing a signal inputted from an external source with a clock signal and latching the synchronized signal, and a method for operating the semiconductor memory device.

In general, a semiconductor memory device such as a double data rate synchronous DRAM (DDR SRAM) receives an address signal, a data signal, and an external command signal outputted from a central processing unit (CPU) and performs desired operations based on the above signals. At this time, the semiconductor memory device synchronizes the above signals with a clock signal and latches the synchronized signals therein. Setup and hold times should be secured between the clock signal and the signals to be synchronized with the clock signal and, specially, the setup time is an important factor in the synchronization.

FIG. 1 illustrates a circuit diagram of a conventional semiconductor memory device.

Referring to FIG. 1, the semiconductor memory device includes a clock buffering unit 110, a synchronization clock generating unit 130, a plurality of signal input units 150, a plurality of delay units 170 and a plurality of latching units 190.

The clock buffering unit 110 buffers an external clock signal CLK_EXT to generate a source clock signal CLK_SRC. The synchronization clock generating unit 130 generates a synchronization clock signal CLK_SYN based on the source clock signal CLK_SRC.

The plurality of signal input units 150 receive a plurality of input signals provided from the external. First to third signal input units 150_1 to 150_3 receive first to third input signals IN1 to IN3, respectively. For the simplicity of explanation, FIG. 1 only illustrates the first to the third signal input units 150_1 to 150_3 and circuits connected to the signal input units 150, which have configurations corresponding to the first to the third signal input units 150_1 to 150_3. Herein, the first to the third input signals IN1 to IN3 are signals that are inputted through corresponding pads (not shown for the simplicity of explanation). Generally, the first to the third signal input units 150_1 to 150_3 are designed to be disposed close to the corresponding pads, respectively.

The plurality of delay units 170 delay output signals of the first to the third signal input units 150_1 to 150_3 for a predetermined delay time to thereby output delayed signals. Thus, the plurality of delay units 170 includes first to third delay units 170_1 to 170_3. Delay times reflected to the first to the third delay units 170_1 to 170_3 are determined by considering setup times between the synchronization clock signal CLK_SYN and the first to the third input signals IN1 to IN3. This will be described later in detail with reference to an operation of the semiconductor memory device.

The plurality of latching units 190 synchronize output signals of the first to the third delay units 170_1 to 170_3 with the synchronization clock signal CLK_SYN and latch the synchronized signals, thereby outputting first to third output signals OUT1 to OUT3. For the purpose, the latching units 190 include first to third latching units 190_1 to 190_3. Configuration and operation of the first to the third latching units 190_1 to 190_3 are apparent to those skilled in the art and thus explanation for the configuration and operation of the latching unit is omitted.

Hereinafter, the operation of the semiconductor memory device illustrated in FIG. 1 is described.

First of all, the external clock CLK_EXT is outputted as the synchronization clock signal CLK_SYN via the clock buffering unit 110 and the synchronization clock generating unit 130. The synchronization clock signal CLK_SYN is inputted to the first to the third latching units 190_1 to 190_3 almost simultaneously.

Meanwhile, the first to the third signal input units 150_1 to 150_3 respectively compare the first to the third input signals IN1 to IN3 inputted through the plurality of pads (not shown) with an internal reference voltage V_REF and output compared results. For instance, if the first input signal IN1 has a voltage level higher than that of the internal reference voltage V_REF, the first signal input unit 150_1 outputs a logic high signal. On the other hand, if the first input signal IN1 has a voltage level lower than that of the internal reference voltage V_REF, the first signal input unit 150_1 outputs a logic low signal. For the reference, a clock enable signal CKEb is a signal that is used to prevent current consumption from being caused by unnecessary operations in the semiconductor memory device. Therefore, the clock enable signal CKEb controls activation or inactivation of the first to the third signal input units 150_1 to 150_3.

Then, output signals of the first to the third signal input units 150_1 to 150_3 are delayed in the first to the third delay units 170_1 to 170_3 by the delay times reflected to the first to the third delay units 170_1 to 170_3, respectively. The delayed signals are transferred to the first to the third latching units 190_1 to 190_3. While the first to the third signal input units 150_1 to 150_3 are disposed close to the corresponding pads, the first to the third latching units 190_1 to 190_3 gather on one place. Therefore, if the first to the third delay units 170_1 to 170_3 are not employed in the semiconductor memory device, the output signals of the first to the third signal input units 150_1 to 150_3 may be transferred to the first to the third latching units 190_1 to 190_3 at different points of time. That is, it is impossible to secure stable setup times between the synchronization clock signal CLK_SYN and the output signals transferred from the first to the third signal input units 150_1 to 150_3 to the first to the third latching units 190_1 to 190_3.

Therefore, in order to secure the setup times, the first to the third delay units 170_1 to 170_3 provide different delay times to the output signals of the first to the third signal input units 150_1 to 150_3 and output the delayed signals generated by reflecting the different delay times. As a result, the first to the third latching units 190_1 to 190_3 receive data at the same points of time. The first to the third latching units 190_1 to 190_3 output the first to the third output signals OUT1 to OUT3 in response to the synchronization clock signal CLK_SYN and the output signals of the first to the third delay units 170_1 to 170_3 whose setup times are secured.

Referring back to FIG. 1, the first to the third delay units 170_1 to 170_3 include a plurality of inverters. The first delay unit 170_1 includes 6 inverters 170_1a to 170_1f; the second delay unit 170_2 includes 4 inverters 170_2a to 170_2d; and the third delay unit 170_3 includes 2 inverters 170_3a and 170_3b. The reason why the first to the third delay units 170_1 to 170_3 include different numbers of inverters therein is that signal transmission times between the first to the third signal input units 150_1 to 150_3 and the first to the third latching units 190_1 to 190_3 are different from each other as described above. Thus, by considering the signal transmission times measured between the signal input units and their corresponding latching units in a state of omitting the delay units, the first delay unit 170_1 having the longest delay time is disposed between the first signal input unit 150_1 and the first latching unit 190_1, which have the shortest signal transmission time there between compared to signal transmission times between the signal input units 150_2 and 150_3 and their corresponding latching units 190_2 and 190_3 described in FIG. 1.

The semiconductor memory device is developing in a direction of implementing a high-speed and low-power architecture. Specially, in order to achieve the high-speed architecture, the semiconductor memory device is designed to receive a number of data simultaneously. This means that the semiconductor memory device has to include a lot of pads. Therefore, the signal transmission time between the signal input unit and the corresponding latching unit also becomes longer and thus the number of inverters constructing the delay unit is also increased. Herein, the inverters constructing the delay unit consume switching current during transferring signals and thus the switching current consumed by the inverters is increased as the number of inverters is increased. That is, in the conventional semiconductor memory device, as the number of pads is increased, the switching current is also increased and thus the increased switching current disturbs the low-power implementation of the semiconductor memory device.

SUMMARY OF THE INVENTION

Embodiments of the present invention are directed to provide a semiconductor memory device for generating a plurality of synchronization clock signals by considering signal transmission times taken from the data input to the data latching, and latching the data using the synchronization clock signals, and a method for operating the semiconductor memory device.

In accordance with an aspect of the present invention, there is provided a semiconductor memory device including: a plurality of input units configured to receive a plurality of data; a plurality of latching units configured to latch output signals of the plurality of input units in response to a plurality of synchronization clock signals; and a synchronization clock generating unit configured to generate the plurality of synchronization clock signals by delaying a source clock signal by a time corresponding to each of signal transmission times taken between the plurality of input units and the plurality of latching units.

In accordance with another aspect of the present invention, there is provided a semiconductor memory device including: a first and a second input unit configured to receive a plurality of data; a first latching unit configured to latch an output signal of the first input unit transmitted through a first data line in response to a first synchronization clock signal; a second latching unit configured to latch an output signal of the second input unit transmitted through a second data line in response to a second synchronization clock signal, wherein a loading value of the second data line is greater than a loading value of the first data line; and a synchronization clock generating unit configured to generate the first and the second synchronization clock signals by delaying a source clock signal by times corresponding to the loading values of the first and the second data lines, respectively.

In accordance with still another aspect of the present invention, there is provided a method for operating semiconductor memory device, the method including: generating a plurality of synchronization clock signals by delaying a source clock signal by times corresponding to signal transmission times taken from input points of time of a plurality of data to points of time where the plurality of data is synchronized with the plurality of synchronization clock signals; and synchronizing the plurality of data with the plurality of synchronization clock signals, respectively.

Since the conventional semiconductor memory device includes a plurality of inverters to secure setup times between a plurality of input signals and one synchronization clock signal, there is a problem of increasing switching current consumption. However, the semiconductor memory device in accordance with the present invention generates the plurality of synchronization clock signals by delaying a reference clock signal by signal transmission times and performs a stable latching operation using the synchronization clock signals. Therefore, it is possible to implement the inventive semiconductor memory device without the inverters included in the conventional semiconductor memory device and thus to minimize the switching current consumption.

DESCRIPTION OF SPECIFIC EMBODIMENTS

Other objects and advantages of the present invention can be understood by the following description, and become apparent with reference to the embodiments of the present invention.

Figure 2:
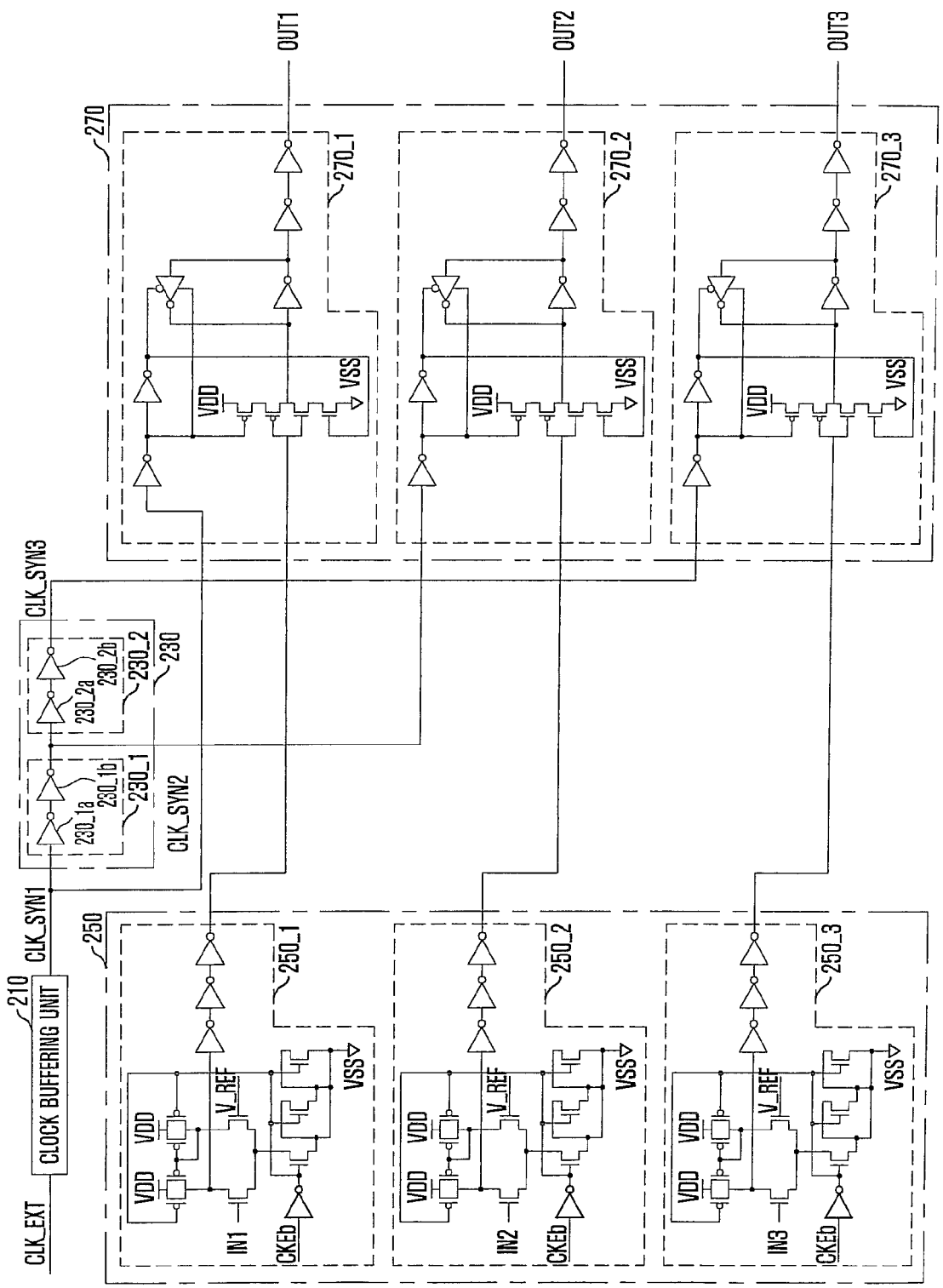
FIG. 2 illustrates a circuit diagram of a semiconductor memory device in accordance with the present invention.

FIG. 2 illustrates a circuit diagram of a semiconductor memory device in accordance with the present invention.

Referring to FIG. 2, the semiconductor memory device includes a clock buffering unit 210, a synchronization clock generating unit 230, a plurality of signal input units 250 and a plurality of latching units 270.

The clock buffering unit 210 buffers an external clock signal CLK_EXT to generate a first synchronization clock signal CLK_SYN1 that is a source clock signal. Herein, the first synchronization clock signal CLK_SYN1 may be inputted to a first latching unit 270_1 to synchronize an output signal of a first signal input unit 250_1. Therefore, in this description, the output signal of the clock buffering unit 210 is referred to as the first synchronization clock signal CLK_SYN1 instead of the source clock signal.

The synchronization clock generating unit 230 generates a second and a third synchronization clock signal CLK_SYN2 and CLK_SYN3 by delaying the first synchronization clock signal CLK_SYN1. Thus, the synchronization clock generating unit 230 may include a first delay unit 230_1 and a second delay unit 230_2. Herein, the second synchronization clock signal CLK_SYN2 outputted from the first delay unit 230_1 is a signal that is generated by delaying the first synchronization clock signal CLK_SYN1 by a time corresponding to a signal transmission time taken between a second signal input unit 250_2 and a second latching unit 270_2. The third synchronization clock signal CLK_SYN3 outputted from the second delay unit 230_2 is a signal that is generated by delaying the first synchronization clock signal CLK_SYN1 by a time corresponding to a signal transmission time taken between a third signal input unit 250_3 and a third latching unit 270_3.

The inventive semiconductor memory device generates a plurality of synchronization clock signals where signal transmission times are reflected, and secures setup times of data signals inputted to the latching units using the synchronization clock signals.

Hereinafter, the first and the second delay units 230_1 and 230_2 will be described in detail.

The first delay unit 230_1 and the second delay unit 230_2 are connected in series and each of them may include two inverters, 230_1a and 230_1b in first delay unit 230_1, and 230_2a and 230_2b in first delay unit 230_2 respectively. Therefore, the second synchronization clock signal CLK_SYN2 outputted from the first delay unit 230_1 is obtained by delaying the first synchronization clock signal CLK_SYN1 by a time corresponding to a loading value of a data line through which an output signal of the second signal input unit 250_2 is transferred to the second latching unit 270_2. The third synchronization clock signal CLK_SYN3 outputted from the second delay unit 230_2 is obtained by delaying the first synchronization clock signal CLK_SYN1 by a time corresponding to a loading value of a data line through which an output signal of the third signal input unit 250_3 is transferred to the third latching unit 270_3.

That is, the second delay unit 230_2 reflects a time corresponding to a difference between the loading value of the data line corresponding to the second signal input unit 250_2 and that of the data line corresponding to the third signal input unit 250_3 on the second synchronization clock signal CLK_SYN2, thereby outputting the third synchronization clock signal CLK_SYN3.

For the simplicity of explanation, it is assumed that the loading value of the data line through which the output signal of the second signal input unit 250_2 is transmitted is greater than that of a data line through which an output signal of the first signal input unit 250_1 is transmitted, and the loading value of the data line through which the output signal of the third signal input unit 250_3 is transmitted is greater than that of the data line through which the output signal of the second signal input unit 250_2 is transmitted. The loading value is great means that the data line is long as much as that. It also means that a signal transmission time is long as much as that.

Namely, the output signal of the first signal input unit 250_1 firstly arrives at the first latching unit 270_1, and then the output signal of the second signal input unit 250_2 arrives at the second latching unit 270_2. Finally, the output signal of the third signal input unit 250_3 arrives at the third latching unit 270_3. Therefore, the first synchronization clock signal CLK_SYN1 can be used as a synchronization clock of the first latching unit 270_1; the second synchronization clock signal CLK_SYN2 can be used as a synchronization clock of the second latching unit 270_2; and the third synchronization clock signal CLK_SYN3 can be used as a synchronization clock of the third latching unit 270_3. In other words, a data signal fast arriving at the latching unit through a data line having a small loading value may secure a setup time using a clock signal as fast as that and a data signal slowly arriving at the latching unit through a data line having a great loading value may secure a setup time using a clock signal as slow as that.

Figure 1:
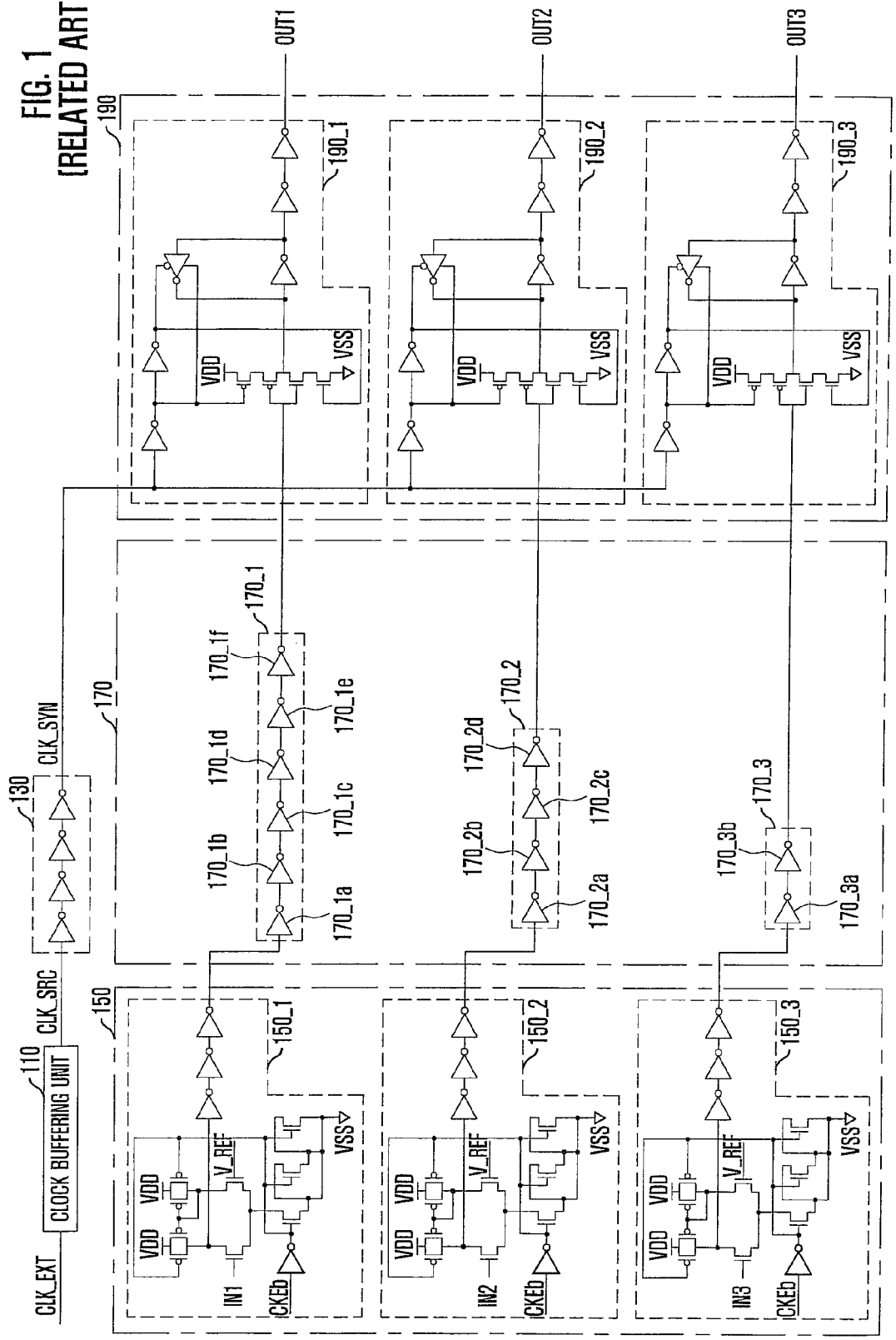
FIG. 1 illustrates a circuit diagram of a conventional semiconductor memory device.

In the meantime, the plurality of signal input units 250 receive a plurality of input signals inputted from the external. The first to the third signal input units 250_1 to 250_3 receive first to third input signals IN1 to IN3, respectively. For the reference, FIG. 2 only illustrates the first to the third signal input units 250_1 to 250_3 as described in FIG. 1. Herein, the first to the third input signals IN1 to IN3 are inputted through corresponding pads (not shown), respectively, and the first to the third signal input units 250_1 to 250_3 may be designed to be disposed close to the corresponding pads, respectively. Since the first to the third signal input units 250_1 to 250_3 perform the same operation as that of the conventional signal input unit, the detailed explanation about the operation of the signal input unit is omitted.

As can be seen from FIG. 2, the inventive semiconductor memory device can be implemented without a plurality of inverters required in conventionally securing setup times. However, since the data lines through which the output signals of the first to the third signal input units 250_1 to 250_3 are transferred have relatively great loading values, repeaters (not shown) may be inserted onto the data lines. In this case, it is preferable to differently design the first and the second delay units 230_1 and 230_2 considering the repeaters.

The plurality of latching units 270 latches the output signals of the first to the third signal input units 250_1 to 250_3 in synchronization with the first to the third synchronization clock signals CLK_SYN1 to CLK_SYN3, respectively, and output the latched signals as the first to the third output signals OUT1 to OUT3. Therefore, the latching units 270 may include the first to the third latching units 270_1 to 270_3. Herein, it is preferable that the first to the third latching units 270_1 to 270_3 are more densely disposed compared to the first to the third signal input units 250_1 to 250_3.

As described above, in accordance with the present invention, the semiconductor memory device can generate the plurality of synchronization clock signals by considering points of time where the plurality of input signals is latched, and latch the input signals using the synchronization clock signals. As a result, the setup times of the input signals can be secured. Moreover, since the inventive semiconductor memory device is implemented without the plurality of inverters included in the conventional semiconductor memory device, the switching current consumption can be minimized.

While the present invention has been described with respect to the specific embodiments, it will be apparent to those skilled in the art that various changes and modifications may be made without departing from the spirit and scope of the invention as defined in the following claims.

Although the above embodiment described in FIG. 2 includes 3 signal input units and 3 latching units, the present invention is applicable to a case of including a plurality of signal input units and a plurality of latching units. Herein, each delay unit of the synchronization clock generating unit should be designed to reflect times corresponding to all of signal transmission times that may occur in the semiconductor memory device.

The present invention may be applicable to a case of using different kinds of transistors. Moreover, the illustrated logic gates and transistors may be implemented to have different locations and types according to polarities of signals inputted thereto.

What is claimed is:
1. A semiconductor memory device, comprising:
 a plurality of input units configured to receive a plurality of data;
 a plurality of latching units configured to receive a plurality of synchronization clock signals at different points of time than each other, and latch output signals of the plurality of input units in response to the plurality of synchronization clock signals; and a synchronization clock generating unit configured to generate the plurality of synchronization clock signals by delaying a source clock signal by a time corresponding to each of signal transmission times taken between the plurality of input units and the plurality of latching units.

2. The semiconductor memory device of claim 1, wherein the synchronization clock generating unit includes a plurality of delay units configured to delay the source clock signal by delay times corresponding to loading values of data lines through which the output signals of the plurality of input units are transmitted, thereby generating the plurality of synchronization clock signals.

3. The semiconductor memory device of claim 1, further comprising a buffering unit configured to buffer an external clock signal to generate the source clock signal.

4. A semiconductor memory device, comprising:
   first and second input units configured to receive a plurality of data;
   a first latching unit configured to receive a first synchronization clock signal at a first point of time and latch an output signal of the first input unit transmitted through a first data line in response to the first synchronization clock signal;
   a second latching unit configured to receive a second synchronization clock signal at a second point of time being different from the first point of time and latch an output signal of the second input unit transmitted through a second data line in response to the second synchronization clock signal, wherein a loading value of the second data line is greater than a loading value of the first data line; and
   a synchronization clock generating unit configured to generate the first and the second synchronization clock signals by delaying a source clock signal by times corresponding to the loading values of the first and the second data lines, respectively.

5. The semiconductor memory device of claim 4, wherein the synchronization clock generating unit includes:
   a first delay unit configured to delay the source clock signal by a time corresponding to the loading value of the first data line, thereby outputting the first synchronization clock signal; and
   a second delay unit configured to delay the source clock signal by a time corresponding to the loading value of the second data line, thereby outputting the second synchronization clock signal.

6. The semiconductor memory device of claim 4, wherein the synchronization clock generating unit includes:

a first delay unit configured to delay the source clock signal by a time corresponding to the loading value of the first data line, thereby outputting the first synchronization clock signal; and
a second delay unit configured to delay the first synchronization clock signal by a time corresponding to a difference between the loading value of the first data line and that of the second data line, thereby outputting the second synchronization clock signal.

7. The semiconductor memory device of claim 6, wherein the first and the second delay units are connected in series.

8. The semiconductor memory device of claim 4, further comprising a buffering unit configured to buffer an external clock signal to generate the source clock signal.

9. The semiconductor memory device of claim 4, further comprising a first and a second pad for transferring the plurality of data to the first and the second input units.

10. The semiconductor memory device of claim 9, wherein the first and the second input units are disposed adjacent to the first and the second pads respectively and the first and the second latching units are more densely arranged compared to the first and the second input units respectively.

11. The semiconductor memory device of claim 4, wherein the first synchronization clock signal is enabled prior to the second synchronization clock signal being enabled.

12. A method for operating a semiconductor memory device, the method comprising:
   generating a plurality of synchronization clock signals by delaying a source clock signal by times corresponding to signal transmission times taken from input points of time of a plurality of data to points of time where the plurality of data is synchronized with the plurality of synchronization clock signals;
   receiving the plurality of synchronization clock signals at different points of time than each other; and synchronizing the plurality of data with the plurality of synchronization clock signals, respectively.

13. The method of claim 12, wherein generating the plurality of synchronization clock signals includes:
   generating a first synchronization clock signal by delaying the source clock signal; and generating a second synchronization clock signal by more delaying the source clock signal compared to the generation of the first synchronization clock signal.

14. The method of claim 13, wherein the signal transmission times have different values, and each of the first and the second synchronization clock signals is generated by delaying the source clock signal by a corresponding one of the signal transmission times.

* * * * *